(12) United States Patent
Hoover et al.

(10) Patent No.: US 8,354,834 B2
(45) Date of Patent: Jan. 15, 2013

(54) METHODS AND APPARATUS FOR ACQUIRING MEASUREMENTS AND PERFORMING AN AUTO-ZERO PROCESS USING A MULTI-RANGE MEASUREMENT APPARATUS

(75) Inventors: Benjamin D. Hoover, Fort Collins, CO (US); Marko Vulovic, Blairstown, NJ (US); Peyman Safa, Hopatcong, NJ (US)

(73) Assignee: Agilent Technologies, Inc., Santa Clara, CA (US)

( * ) Notice: Subject to any disclaimer, the term of this patent is extended or adjusted under 35 U.S.C. 154(b) by 666 days.

(21) Appl. No.: 12/492,958

(22) Filed: Jun. 26, 2009

(65) Prior Publication Data

US 2010/0327850 A1    Dec. 30, 2010

(51) Int. Cl.
*G01R 15/00* (2006.01)
*G01R 31/26* (2006.01)
(52) U.S. Cl. .................... 324/115; 324/762.01
(58) Field of Classification Search .......... 324/115, 324/72, 750.01–750.1, 762.01–762.1; 341/139, 341/155; 438/14–18; 257/48
See application file for complete search history.

(56) References Cited

U.S. PATENT DOCUMENTS

| | | | | |
|---|---|---|---|---|
| 6,098,463 | A | * | 8/2000 | Goldberg ................. 73/646 |
| 6,583,662 | B1 | * | 6/2003 | Lim ....................... 327/553 |

OTHER PUBLICATIONS

Nolan, Eric "Demystifying Auto-Zero Amplifiers—Part 1", Analog Dialogue 34-2, 2000, pp. 1-3.
Nolan, Eric, et al., "Demystifying Auto-Zero Amplifiers-2", Analog Dialogue 34-3, 2000, pp. 1-2.

\* cited by examiner

*Primary Examiner* — Tung X Nguyen

(57) ABSTRACT

In one embodiment, a measurement apparatus has an input stage, an output stage and a multiplexer. The input stage has a signal input, a plurality of measurement range outputs, and a plurality of selectable gain stages, with each of the selectable gain stages being coupled between the signal input and a respective one of the measurement range outputs. The output stage has a measurement acquisition path between an analog measurement input and a digital measurement output. The measurement acquisition path includes an analog-to-digital converter. The multiplexer has i) a plurality of data inputs, at least two of which are coupled to respective ones of the plurality of measurement range outputs, and at least one of which is a reference input configured to receive a signal to which signals appearing at the measurement range outputs are commonly referenced, ii) a data output coupled to the analog measurement input of the output stage, and iii) a control input.

16 Claims, 4 Drawing Sheets

METHODS AND APPARATUS FOR ACQUIRING MEASUREMENTS AND PERFORMING AN AUTO-ZERO PROCESS USING A MULTI-RANGE MEASUREMENT APPARATUS

BACKGROUND

A variety of measurement and control systems make use of multi-range measurement apparatus (i.e., apparatus that is capable of measuring a signal via one or more of a plurality of selectable gain stages).

Before its initial use, a multi-range measurement apparatus is typically calibrated. Calibration involves measuring a characteristic of the measurement apparatus itself, and then using the measured characteristic to adjust measurements made in the normal course of using the measurement apparatus. One common form of calibration involves "zeroing" the measurement apparatus (i.e., measuring an offset voltage or other characteristic of the measurement apparatus, so that the offset voltage or other characteristic can be used to adjust measurements made in the normal course of using the measurement apparatus).

Calibration may be repeated on a periodic or non-periodic basis (e.g., after use for a particular number of hours, after deployment in a new measurement setup, after an environmental change, or after certain changes in the signal being measured). Typically, each range of a multi-range measurement apparatus is calibrated (or "zeroed") independently and serially. That is, a first range of the measurement apparatus is selected and calibrated; then, a second range is selected and calibrated; and so on, for each range of the measurement apparatus.

SUMMARY

In one embodiment, a measurement apparatus has an input stage, an output stage and a multiplexer. The input stage has a signal input, a plurality of measurement range outputs, and a plurality of selectable gain stages. Each of the selectable gain stages is coupled between the signal input and a respective one of the measurement range outputs. The output stage has a measurement acquisition path between an analog measurement input and a digital measurement output. The measurement acquisition path includes an analog-to-digital converter. The multiplexer has i) a plurality of data inputs, at least two of which are coupled to respective ones of the plurality of measurement range outputs, and at least one of which is a reference input configured to receive a signal to which signals appearing at the measurement range outputs are commonly referenced, ii) a data output coupled to the analog measurement input of the output stage, and iii) a control input.

In another embodiment, a measurement apparatus has a multi-range gain means, an output means, and a signal selection means. The multi-range gain means amplifies an input signal and provides a plurality of output signals corresponding to different measurement ranges. The output means comprises a means for converting analog measurements to digital measurements. The signal selection means couples i) one of the plurality of output signals corresponding to the different measurement ranges, or a reference signal to which the plurality of signals corresponding to the different measurement ranges is referenced, to ii) the output means.

In yet another embodiment, a method for adjusting a characteristic of a measured signal, wherein the measured signal is referenced to a reference signal, comprises performing both a calibration process and a measurement process. The calibration process is performed by i) coupling a reference signal, to which the measured signal is referenced, to an output stage of a measurement apparatus, and then ii) recording an output of the output stage as a characteristic of the output stage. The measurement process is performed by i) selecting any one of a plurality of gain stages; ii) coupling the measured signal to the output stage of the measurement apparatus, via the selected one of the gain stages, and then recording an output of the output stage as a characteristic of the measured signal; and iii) adjusting the characteristic of the measured signal for the characteristic of the output stage.

BRIEF DESCRIPTION OF THE DRAWINGS

Illustrative embodiments of the invention are illustrated in the drawings, in which.

DETAILED DESCRIPTION

Figure 1:
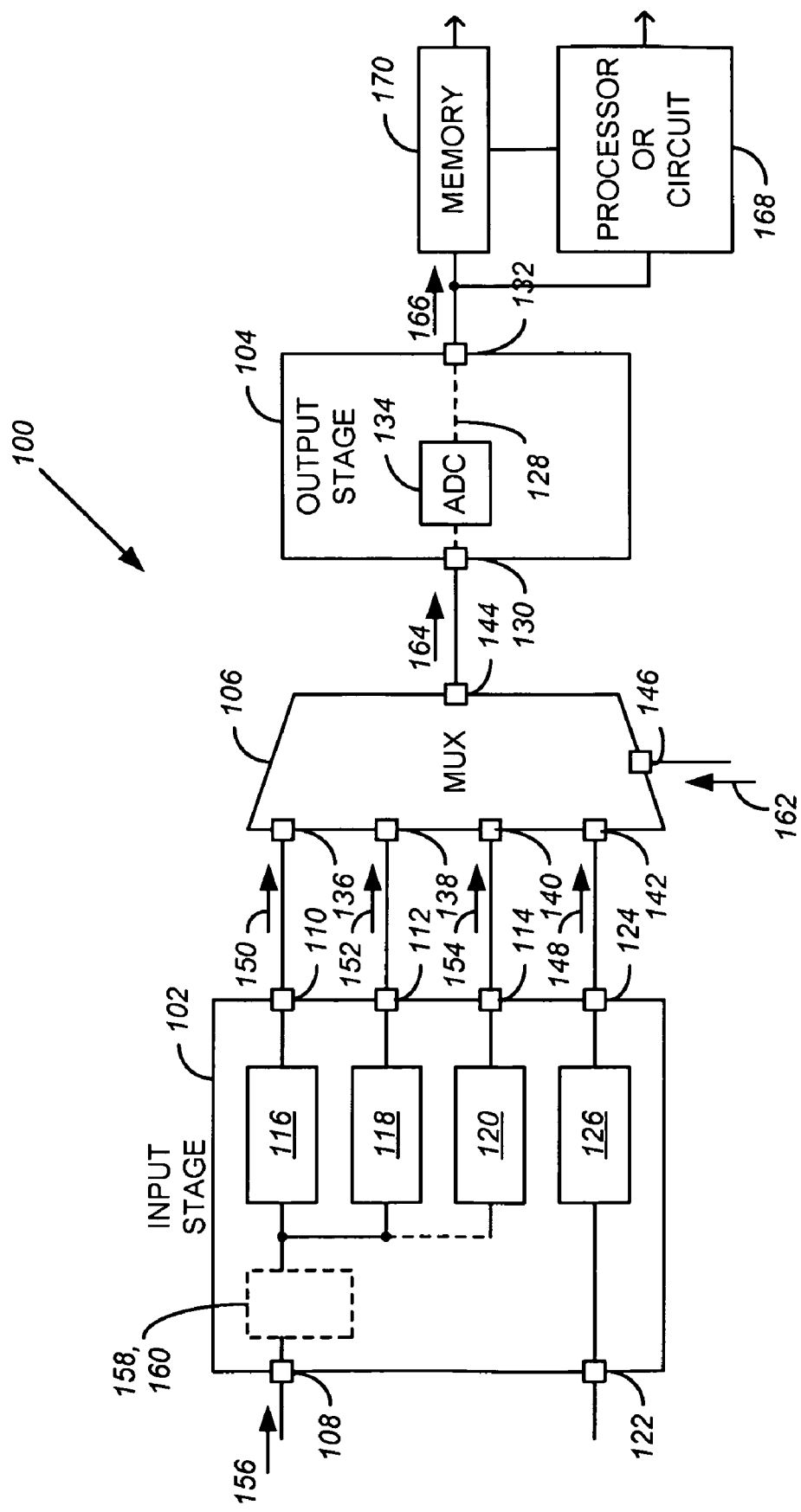
FIG. 1 illustrates a first exemplary measurement apparatus.

FIG. 1 illustrates a first exemplary measurement apparatus 100. The apparatus 100 comprises an input stage 102, an output stage 104, and a multiplexer 106. The input stage 102 has a signal input 108, a plurality of measurement range outputs (i.e., two or more measurement range outputs 110, 112, 114), and a plurality of selectable gain stages 116, 118, 120. Each of the selectable gain stages 116, 118, 120 corresponds to a different measurement range of the apparatus 100 and is coupled between the signal input 108 and a respective one of the measurement range outputs 110, 112, 114. Although the apparatus 100 is shown to have three gain stages 116, 118, 120, different embodiments of the apparatus 100 could have any number of two or more gain stages.

The input stage 102 may also comprise a reference signal input 122 and a reference signal output 124. In some cases, a buffer, amplifier or conditioning circuitry 126 may be provided between the reference signal input 122 and the reference signal output 124.

The output stage 104 of the apparatus 100 has (or defines) a measurement acquisition path 128 between an analog measurement input 130 and a digital measurement output 132. As shown, the measurement acquisition path 128 includes an analog-to-digital converter (ADC) 134. However, the measurement acquisition path 128 may also include other circuitry, as will be discussed later in this description.

The multiplexer 106 has a plurality of data inputs 136, 138, 140, 142, a data output 144, and a control input 146. At least two of the data inputs 136, 138, 140 are coupled to respective ones of the plurality of measurement range outputs 110, 112, 114, and at least one of the data inputs 142 is a reference input. The reference input 142 is configured to receive a signal 148 to which signals 150, 152, 154 appearing at the measurement range outputs 110, 112, 114 are commonly referenced.

The data output 144 of the multiplexer 106 is coupled to the analog measurement input 130 of the output stage 104.

In operation, the measurement apparatus 100 receives a signal 156 to be measured at the signal input 108. The signal is then provided to one or more of the gain stages 116, 118, 120 (i.e., a form of multi-range gain means) for the purpose of generating one or more signals 150, 152, 154 corresponding to different measurement ranges at the measurement range outputs 110, 112, 114. In FIG. 1, the signal 156 is provided to all of the gain stages 116, 118, 120 in parallel. However, in some cases, a switch 158 may be provided between the signal input 108 and the gain stages 116, 118, 120, so that the signal 156 can be provided to only a selected one of the gain stages 116, 118, 120. Also, the signal 156 may in some cases be routed to the gain stages 116, 118, 120 via a buffer, amplifier or conditioning circuitry 160 that is coupled between the signal input 108 and the gain stages 116, 118, 120.

In response to a control signal 162 received at its control input 146, the multiplexer 106 (i.e., a form of signal selection means) couples a selected one of the plurality of measurement range outputs 110, 112, 114, or the reference input 142, to the analog measurement input 130 of the output stage 104. The control signal 162 may be provided to the multiplexer 106 in various ways. For example, the control signal 162 may be pre-programmed via firmware or software; the control signal 162 may be dynamically determined by a microprocessor or circuit that responds to the digital measurement output 132 or other feedback of the apparatus 100 or the environment in which it is used; or the control signal 162 may be supplied by a user's manipulation of a switch or input to a user interface.

The output stage 104 converts the analog measurement 164 received at its input 130 to a digital measurement 166 at its output 132. The digital measurement 166 may then be, for example, provided to a downstream process (e.g., a microprocessor or circuit 168); displayed; or stored in a memory 170 for later retrieval. In some cases, the microprocessor or circuit 168 may be an auto-zero microprocessor or circuit that is configured to perform an auto-zero process (and possibly other functions). In the case of an auto-zero microprocessor, the microprocessor may be programmed by software or firmware that instructs the microprocessor how to perform an auto-zero process.

When the apparatus is provided with an auto-zero microprocessor or circuit, or some other device for performing an auto-zero process, the auto-zero microprocessor or circuit may be configured to adjust i) values derived from the digital measurement output 132 when any of the plurality of measurement range outputs 110, 112, 114 of the input stage 102 are coupled to the analog measurement input 130 of the output stage 104, in response to ii) a value read from the digital measurement output 132 when the reference input 142 is coupled to the analog measurement input 130 of the output stage 104. In this manner, the characteristic (e.g., a voltage) of a measured signal 156 may be adjusted for a characteristic (e.g., voltage offset) of the apparatus 100 (and particularly, of the output stage 104). Typically, the adjustment made will be a simple subtraction or addition of one value from/to the other. However, other sorts of auto-zero processes could be employed.

The values used by the auto-zero microprocessor or circuit may be stored in the memory 170.

Figure 2:
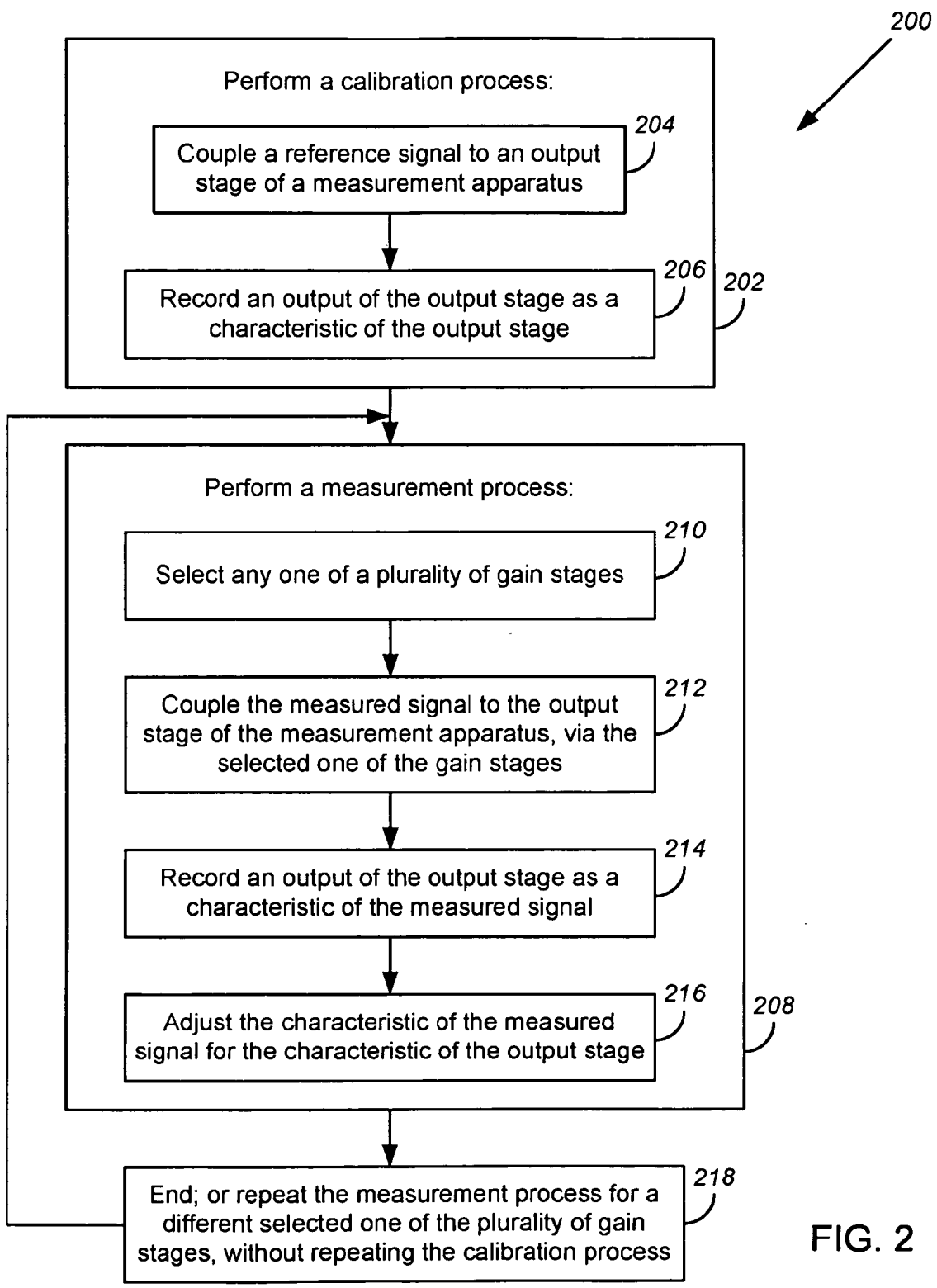
FIG. 2 illustrates an exemplary method for adjusting a characteristic of a measured signal referenced to a reference signal.

FIG. 2 illustrates an exemplary method 200 for adjusting a characteristic of a measured signal referenced to a reference signal. By way of example, the method 200 may be performed using apparatus 100 such as that which is shown in FIG. 1. The method 200 comprises a calibration process 202 and a measurement process 208. Performing the calibration process 202 includes coupling a reference signal 148 to an output stage 104 of a measurement apparatus 100 (at block 204), and then recording an output 166 of the output stage 104 as a characteristic of the output stage 104 (at block 206).

Performing the measurement process 208 includes selecting any one of a plurality of gain stages 116, 118, 120 (at block 210). Via the selected one of the gain stages 116, 118, 120, the measured signal 156 is coupled to the output stage 104 of the measurement apparatus 100 (at bock 212). Then, for the selected one of the gain stages 116, 118, 120, an output 166 of the output stage 104 is recorded as a characteristic of the measured signal 156 (at block 214), and the characteristic of the measured signal 156 is adjusted for the characteristic of the output stage 104 (at block 216). Optionally, the measurement process 208 may be repeated for a different selected one (or more) of the plurality of gain stages 116, 118, 120, without repeating the calibration process 102 (at block 218). That is not say, however, that the calibration process cannot or should not be repeated on a regular basis. However, it is not necessary to repeat the calibration process after each gain change, because the calibration process is valid for all gain ranges.

Figure 3:
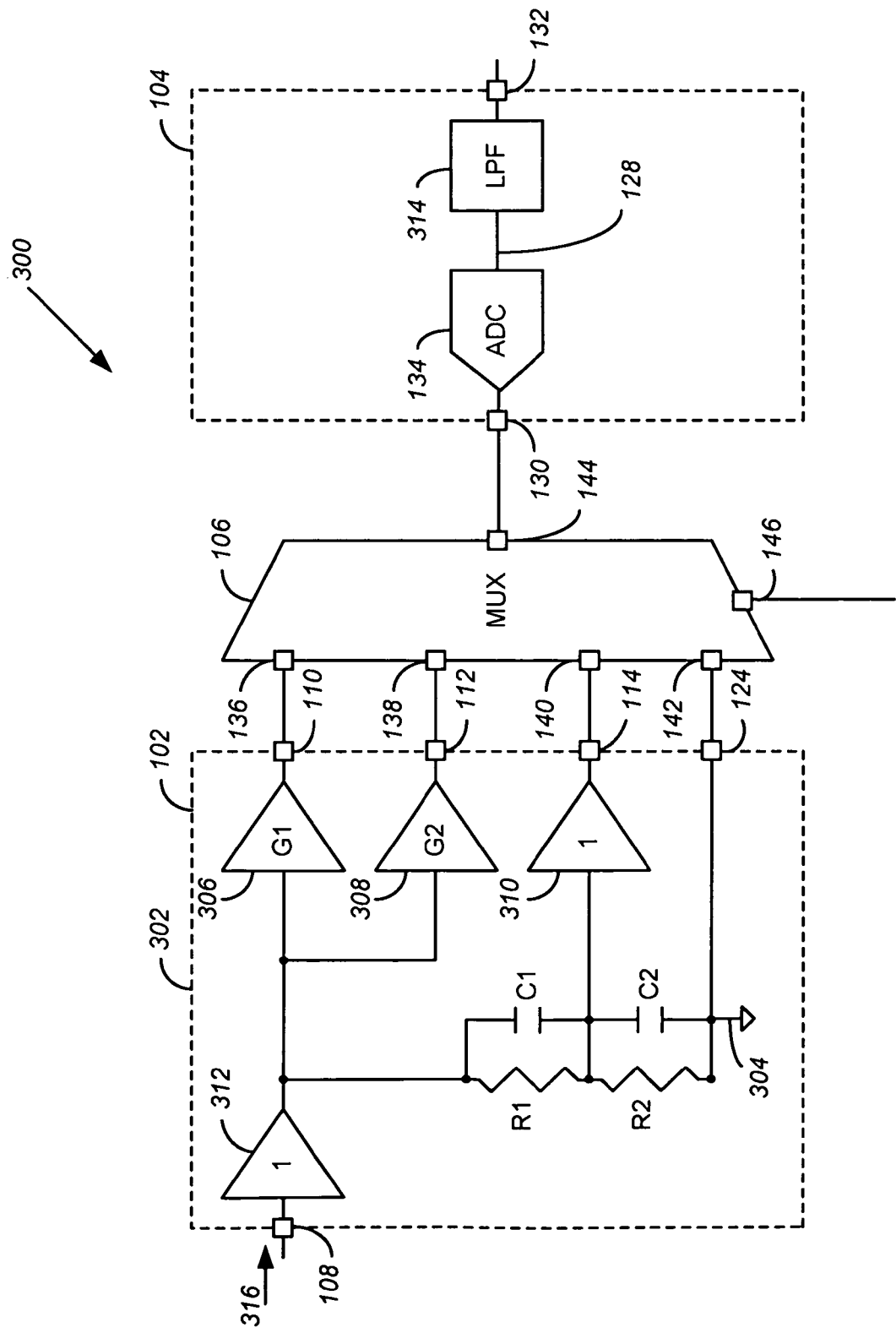
FIG. 3 illustrates a second exemplary measurement apparatus.

FIG. 3 illustrates a second exemplary measurement apparatus 300. Those elements of the apparatus 300 that perform functions similar to corresponding elements of the measurement apparatus 100 are numbered using the same reference numbers, and may not be described in further detail.

The measurement apparatus 300 is configured for measurement of single-ended signals. In this embodiment, the input stage 102 is a single-ended input stage 302, and the reference signal 148 is a ground signal 304. All of the signals 150, 152, 154 appearing at the measurement range outputs 110, 112, 114 are referenced to the ground signal 304, via the RC network comprised of resistors R1 and R2 and capacitors C1 and C2.

The plurality of gain stages 116, 118, 120 is respectively implemented using amplifiers 306 and 308, and buffer 310. The amplifier 306 provides a gain G1, the amplifier 308 provides a gain G2, and the buffer 310 provides a unity gain (i.e., gain of "1"). In some embodiments, one or more of the amplifiers 306, 308 and buffer 310 may be implemented as chopper-stabilized amplifiers. Chopper-stabilized amplifiers are known in the art, and will not be described in detail here. Of note, however, is that a chopper-stabilized amplifier imparts an extremely low voltage offset and offset drift to its output signal.

The apparatus 300 further comprises an optional buffer 312 between the signal input 108 and the gain stages 116, 118, 120. The apparatus 300 also comprises an optional low pass filter (LPF) 314, coupled in the measurement acquisition path 128 between the ADC 134 and the digital measurement output 132.

Figure 4:
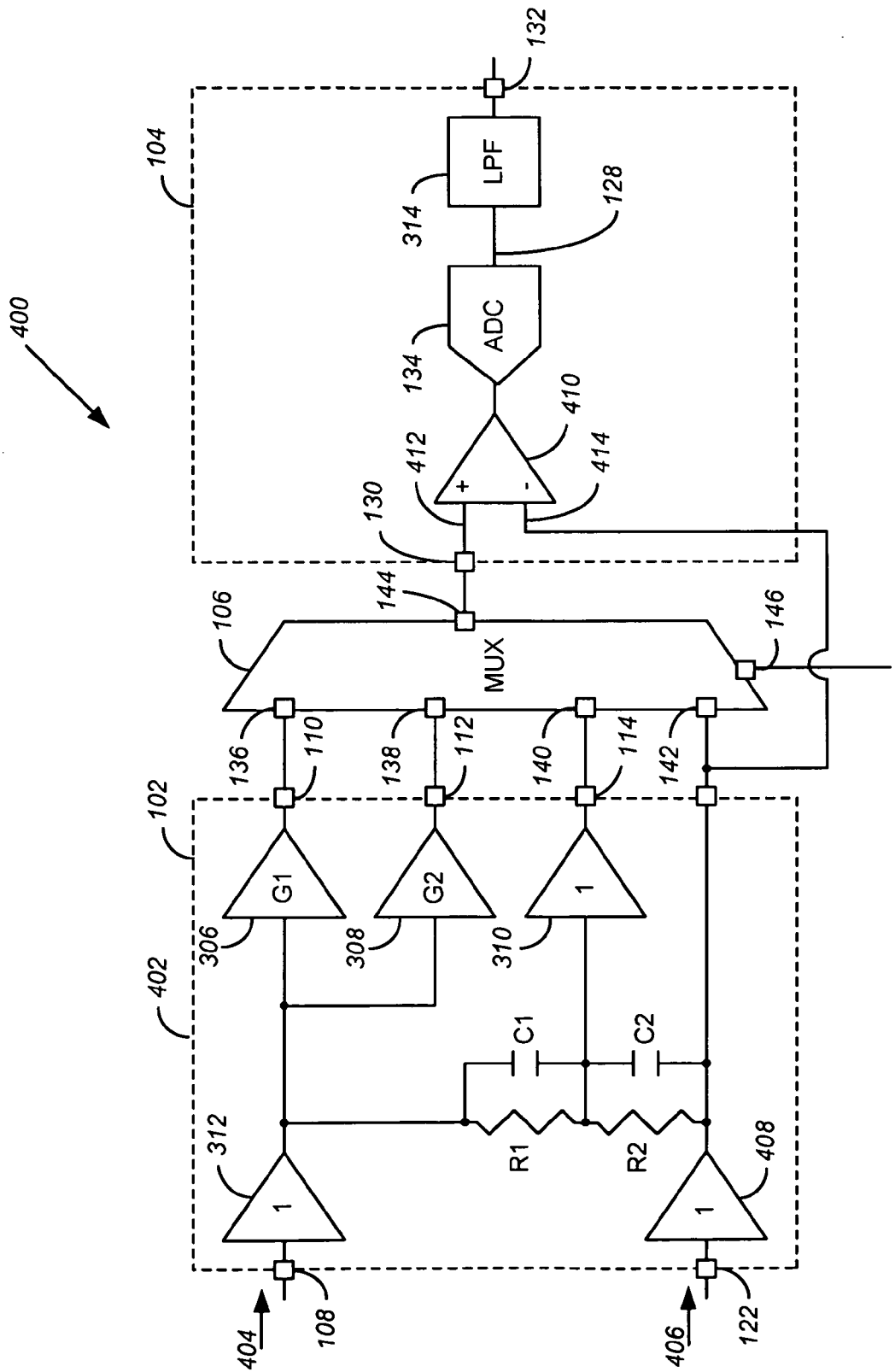
FIG. 4 illustrates a third exemplary measurement apparatus.

FIG. 4 illustrates a third exemplary measurement apparatus 400. As with FIG. 3, those elements of the apparatus 400 that perform functions similar to corresponding elements of the measurement apparatus 100 or 300 are numbered using the same reference numbers, and may not be described in further detail.

The measurement apparatus 400 is configured for measurement of differential signals. In this embodiment, the input stage 102 is a differential input stage 402, and the signal input 108 is configured to receive a first component 404 of a differential signal. The reference signal input 122 is configured to receive a second component of the differential input signal. The first component 404 of the differential signal is processed similarly to the single-ended signal 316 received by the apparatus 300 (FIG. 3). The second component 406 of the differential signal is received by a buffer 408, and then provided to reference input 142 of the multiplexer 106. In the claims, it is indicated that the reference input 142 of the multiplexer 106 is configured to receive the second component 406 of the differential signal. This recitation is meant to include 1) direct receipt of the second component 406 of the differential signal, or 2) receipt of a buffered, amplified or conditioned form of the second component 406. In either case, it is noted that the gains 306, 308 are taken with respect to the signal appearing at the reference input 142, and not ground. The signal appearing at the reference input 142 is also coupled to an instrumentation amplifier 410, as will be described below.

The measurement acquisition path 128 of the output stage 104 of the apparatus 400 may further comprise an instrumentation amplifier 410, coupled between the analog measurement input 130 and the ADC 134. The instrumentation amplifier 410 has i) a first instrumentation amplifier input 412 that is coupled to the data output of the multiplexer 106, and ii) a second instrumentation amplifier input 414 that is configured to receive the second component 406 of the differential signal, which component 406 is received via the buffer 408.

The measurement apparatus 100, 300, 400 disclosed herein is useful, in some respects, in that it enables a single calibration measurement (i.e., zero measurement) to be made for all measurement ranges of a multi-range measurement apparatus. The single calibration measurement can then be used to zero measurements for all measurement ranges, thereby enabling faster range switching. In the past, a new calibration measurement was typically required each time a range switch was made. This is not to say that a single calibration measurement will suffice for all measurement scenarios in which the measurement apparatus 100, 300 or 400 is used. To be sure, various changes in the signal being measured, the environment of the measurement apparatus (e.g., temperature, humidity, power supply voltage, etc.), and other events will create needs for new calibration measurements. However, a range switch made during a particular measurement scenario will typically not create a need for a new calibration measurement.

The single calibration measurement used by all ranges of the measurement apparatus 100, 300, 400 can be used to remove any offset errors imparted by the ADC 134, as well any offset errors imparted by the instrumentation amplifier 410. In addition, the calibration measurement can be used to remove limited common mode errors of the instrumentation amplifier 410 (thereby improving its common mode rejection ratio (CMRR)).

The measurement apparatus 100, 300, 400 disclosed herein is also useful because it enables the acquisition of a zero measurement without shorting the input terminal 108 to ground (in FIG. 3), or without shorting the input terminals 108 and 122 (in FIG. 4). This is particularly useful when the measurement apparatus 100, 300, 400 is used to continuously monitor an input signal.

What is claimed is:

1. A measurement apparatus, comprising:
   a differential input stage having a signal input configured to receive a first component of a differential signal, a plurality of measurement range outputs, and a plurality of selectable gain stages, each of the selectable gain stages coupled between the signal input and a respective one of the measurement range outputs;
   an output stage having a measurement acquisition path between an analog measurement input and a digital measurement output, the measurement acquisition path including an analog-to-digital converter (ADC); and
   a multiplexer having i) a plurality of data inputs, at least two of which are coupled to respective ones of the plurality of measurement range outputs, and at least one of which is a reference input configured to receive a second component of the differential signal, to which signals appearing at the measurement range outputs are commonly referenced, ii) a data output coupled to the analog measurement input of the output stage, and iii) a control input.

2. The measurement apparatus of claim 1, wherein the plurality of selectable gain stages are configured to receive the first component of the differential signal in parallel.

3. The measurement apparatus of claim 1, wherein the measurement acquisition path of the output stage further includes an instrumentation amplifier, coupled between the analog measurement input and the ADC, the instrumentation amplifier having i) a first instrumentation amplifier input coupled to the data output of the multiplexer, and ii) a second instrumentation amplifier input configured to receive the second component of the differential signal.

4. The measurement apparatus of claim 3, wherein a calibration measurement comprising measuring the second component of the differential signal is used to reduce common mode errors of the instrumentation amplifier.

5. The measurement apparatus of claim 1, further comprising:
   an auto-zero microprocessor configured to adjust i) values read from the digital measurement output when any of the plurality of measurement range outputs of the input stage are coupled to the analog measurement input of the output stage, in response to ii) a value read from the digital measurement output when the reference input is coupled to the analog measurement input of the output stage.

6. The measurement apparatus of claim 5, further comprising a memory configured to store the values read from the digital measurement output.

7. The measurement apparatus of claim 1, further comprising:
   an auto-zero circuit configured to adjust i) values read from the digital measurement output when any of the plurality of measurement range outputs of the input stage are coupled to the analog measurement input of the output stage, in response to ii) a value read from the digital measurement output when the reference input is coupled to the analog measurement input of the output stage.

8. The measurement apparatus of claim 7, further comprising a memory configured to store the values read from the digital measurement output.

9. The measurement apparatus of claim 1, wherein at least one of the gain stages comprises a chopper-stabilized amplifier.

10. A measurement apparatus, comprising:
    an input stage comprising multi-range gain means for receiving an input signal and providing a plurality of output signals corresponding to different measurement ranges, the input stage being configured to output at least one of the plurality of output signals and a reference signal to which the plurality of output signals are commonly referenced;
    an output stage comprising means for converting analog measurements to digital measurements; and
    signal selection means for coupling the reference signal to the output stage for performing a calibration process and for coupling one of the plurality of output signals corresponding to the different measurement ranges to the output stage for performing a measurement process.

11. The measurement apparatus of claim 10, wherein the multi-range gain means is a single-ended multi-range gain means.

12. The measurement apparatus of claim 10, wherein the multi-range gain means is a differential multi-range gain means.

13. The measurement apparatus of claim 12, wherein the output means further comprises an amplification means, coupled between the signal selection means and the means for converting the analog measurement to the digital measurement.

14. The measurement apparatus of claim 10, wherein the multi-range gain means comprises at least two amplifiers connected in parallel with one another.

15. The measurement apparatus of claim 14, further comprising:
    auto-zero means for adjusting digital measurements output from the output means, when any of the plurality of output signals corresponding to the different measurement ranges are coupled to the output means, in response to a digital measurement output from the output means when the reference signal is coupled to the output means.

16. A measurement apparatus comprising:
    multi-range gain means for receiving an input signal and providing a plurality of output signals corresponding to different measurement ranges;
    output means comprising means for converting analog measurements to digital measurements;
    signal selection means for coupling i) one of the plurality of output signals corresponding to the different measurement ranges, or a reference signal to which the plurality of output signals is referenced, to ii) the output means; and
    auto-zero means for adjusting i) digital measurements output from the output means when any of the plurality of output signals corresponding to the different measurement ranges are coupled to the output means, in response to ii) a digital measurement output from the output means when the reference signal is coupled to the output means.

\* \* \* \* \*